United States Patent
Doormann et al.

Patent Number: 5,122,250
Date of Patent: Jun. 16, 1992

[54] METHOD OF MANUFACTURING IRON GARNET LAYERS

[75] Inventors: Volker Doormann; Jens-Peter Krumme, both of Hamburg; Wolfgang J. Radtke, Scharbeutz, all of Fed. Rep. of Germany

[73] Assignee: North American Philips Corporation, New York, N.Y.

[21] Appl. No.: 752,960

[22] Filed: Aug. 29, 1991

Related U.S. Application Data

[63] Continuation of Ser. No. 626.323. Dec. 13, 1990, abandoned, which is a continuation of Ser. No. 379,507, Jul. 13, 1989, abandoned.

Foreign Application Priority Data

Jul. 29, 1988 [DE] Fed. Rep. of Germany ........ 3825788

[51] Int. Cl.⁵ ............................................. C23C 14/34
[52] U.S. Cl. ............................ 204/192.26; 204/192.15
[58] Field of Search .................... 204/192.12, 192.15, 204/192.2, 192.26

[56] References Cited

U.S. PATENT DOCUMENTS

| | | | |
|---|---|---|---|
| 3,607,698 | 9/1971 | Kay | 204/192 |
| 3,949,387 | 4/1976 | Chaudhari et al. | 340/174 YC |
| 4,444,635 | 4/1984 | Kobayashi et al. | 204/192.15 |
| 4,778,580 | 10/1988 | Doormann et al. | 204/192.15 X |
| 4,849,080 | 7/1989 | Doormann et al. | 204/192.15 |

OTHER PUBLICATIONS

J. Schneider et al., "$O_2$ Contaminated . . . Films", J. Appl. Phys. 49(3), 3/1978, pp. 1747–1749.

*Primary Examiner*—Nam Nguyen
*Attorney, Agent, or Firm*—Norman N. Spain

[57] ABSTRACT

A method of manufacturing ion garnet layers having refractive indices n adjusted in a defined manner and lattice constants $a_o$ adjusted in a defined manner, in which the layers are deposited on a substrate by means of rf cathode sputtering using a target comprising substantially a garnet phase besides residual phases of substantially the same sputtering rates in a noble gas plasma of an ion energy of the ions bombarding the growing layer of smaller than $10^2$ eV and at a pressure in the range from 0.1 to 2.0 Pa, the noble gas being doped with up to 5% by volume of at least one reactive gas.

17 Claims, 3 Drawing Sheets

METHOD OF MANUFACTURING IRON GARNET LAYERS

This is a continuation of application Ser. No. 07/626,323, filed Dec. 13, 1990, which is a continuation of application Ser. No. 379,507, filed Jul. 13, 1989, both abandoned.

BACKGROUND OF THE INVENTION

The invention relates to a method of manufacturing iron garnet layers having refractive indices n adjusted in a defined manner and lattice constants $a_o$ adjusted in a defined manner, in which the layers are deposited on a substrate by means of rf cathode sputtering using a target consisting substantially of an iron garnet phase besides residual phases of substantially the same sputtering rate in a noble gas plasma of an ion energy of the ions bombarding the growing layer of smaller than $10^2$ eV and a pressure in the range from 0.1 to 2.0 Pa.

Such a method is known from German Patent Application P 3704378.1. Layers which are manufactured according to they known method are used for the building-up of optical waveguides for non-reciprocal optical components. By means of the known method it is possible in particular to vary the refractive index n of the deposited layers by up to 0.7% by variation of the gas pressure of the plasma in the range from 0.3 to 0.8 Pa, in which the values for the refractive indices and for the lattice constants decrease with increasing gas pressure. It is assumed that the dependence of the refractive index n on the pressure of the plasma, for example, an argon plasma, is substantially the result of the variation of the bombardment of the growing layer by low energetic ions, in this case argon ions. As a result of the different back-sputtering rates of the elements taking part in the building-up of the layer, the composition of the manufactured layer varies and hence the value for the refractive index n and for the lattice constant $a_o$ also varies.

It has proved in practice that a larger variation width of the values for the refractive index n and the lattice constant $a_o$ of the deposited layers is desired, for example, to enable the optical adaptation of partial layers of a waveguide structure. This is of importance in particular when several targets are to be used for the manufacture of a waveguide structure.

SUMMARY OF THE INVENTION

It is therefore the object of the invention to improve the method mentioned in the opening paragraph in such a manner that the values for the refractive index n and the lattice constant $a_o$ of iron garnet layers manufactured by means of rf cathode sputtering can be adjusted in a reproduceable manner at a defined value in a wider range.

According to the invention this object is achieved in that the noble gas is doped with up to 5% by volume of at least one reactive gas.

DETAILED DESCRIPTION OF THE INVENTION

Figure 1:
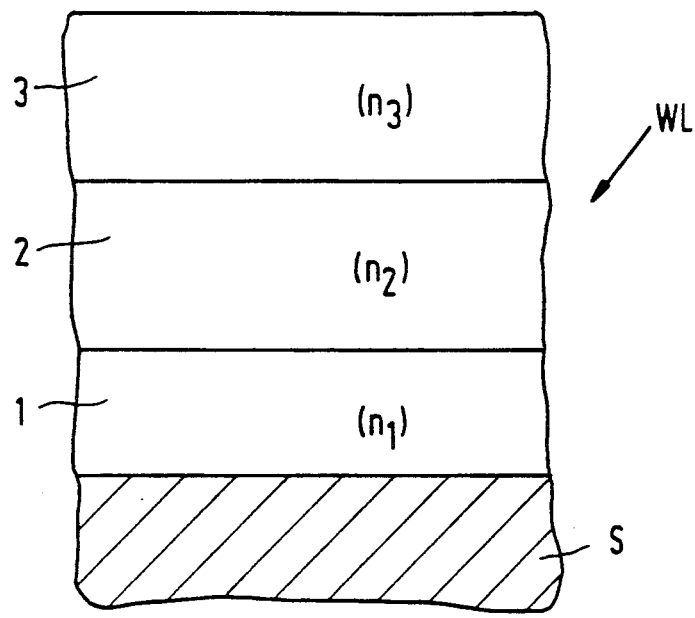
FIG. 1 is a sectional view of a prior art planar waveguide.

According to an advantageous embodiment of the method according to the invention the noble gas is doped with up to 2% by volume of at least one reactive gas.

According to an advantageous further embodiment of the method of the invention argon is used as the noble gas. When an argon plasma is doped, for example, with up to 5% by volume with oxygen as a reactive gas, the advantage is obtained that, for example, at a constant overall gas pressure of preferably 0.6 Pa the values for the refractive index n of the deposited layers can be varied by up to 0.7% with a reproducibility of better than $\pm 0.02\%$.

The simultaneous variation of the overall gas pressure in the range from 0.3 to 1.0 Pa and of the oxygen share in the plasma in the range from 0-2% by volume leads to a reproducible variation of the refractive index up to 1.5% in monocrystalline iron garnet layers and up to 2% in non-crystalline, for example, amorphous or X-ray amorphous, iron garnet layers.

If an argon plasma of an overall gas pressure $p_{ges}=0.6$ Pa is doped with up to 2% by volume of hydrogen as a reactive gas, the advantage is obtained that the refractive index n of monocrystalline iron garnet layers is varied by 1.5% and the refractive index n of non-crystalline, for example, amorphous or X-ray amorphous, iron garnet layers is varied by up to 1%.

Likewise, the values for the lattice constant $a_o$ of a monocrystalline-deposited layer can be controlled via the overall gas pressure and the doping of the plasma with a reactive gas.

According to further advantageous embodiments of the method according to the invention a mixture of noble gases of different mass numbers are use. In particular, mixtures of argon and krypton or of argon and krypton and xenon are used. As is known from P 3704378.1 a reproducible variation of the values for the refractive index n and the lattice constant $a_o$ of a monocrystalline-deposited iron garnet layer can be achieved by variation of the pressure of an argon plasma in the range from 0.1 to 2.0 Pa.

For example, for the adaptation of layers of a multilayer optical waveguide the expansion of the adjusting range of the values for the refractive index n and the lattice constant $a_o$ of iron garnet layers with respect to the values which can be achieved in a pure argon plasma is desirable. Advantageously this can be achieved without changing the target from which the iron garnet layers are deposited when argon is replaced entirely or partly by krypton or by xenon or by krypton and xenon in accordance with the desired values for the refractive index n and optionally the lattice constant $a_o$ of the layers to be deposited. It is assumed that this effect is based on the fact that the probability of the reflection of argon ions impinging on an iron garnet target is larger than that of krypton ions and of xenon ions because the mass number of argon is smaller and the mass number of krypton and xenon is larger than the average atom mass of iron garnet. Energetic noble gas atoms reflected at the target lead to bombardment of the layer growing on the substrate and hence to backsputtering of layer components with low sputtering rate, which results in a variation of the composition of the deposited layers and hence a variation of the refractive index n and the lattice constant $a_o$ in question, without the crystalline growth of the growing layer being disturbed.

Investigations within the scope of the present method have proved that krypton plasmas of an overall pressure of 0.5 Pa which were used in a rf- magnetron cathode sputtering method for the deposition of bismuth-containing iron garnet layers provide iron garnets which are richer in bismuth by approximately 12% by weight than argon plasmas of an overall pressure of 0.5 Pa. This leads to an increase of the values for the refractive index n of monocrystalline and amorphous layers by up to 1.5% and to an increase of the values for the lattice constant $a_o$ of monocrystalline layers by up to 1.5%.

According to an advantageous embodiment of the method according to the invention iron garnet layers are manufactured having a composition corresponding to the general formula $$(A, B)_3(A, B)_5O_{12}$$

with

A = at least a rare earth metal, Bi, Pb, and/or Ca and
B = Ga, Al, Fe, Co, Ni, Mn, Ru, Ir, In and/or Sc.

Since the epitaxial process by means of cathode sputtering in contrast the for example, liquid phase epitaxial processes occurs remote from the thermo-chemical equilibrium, the manufacture of, for example, garnet layers in non-equilibrium compositions without extraneous phase is also possible.

For example, monophase iron garnet layers were manufactured in a monocrystalline manner from one and the same target with the following compositions:
$Gd_{2.04}Bi_{0.99}Fe_{4.15}Ga_{0.82}O_{12}$; $Gd_{2.08}Bi_{0.88}Fe_{4.21}Ga_{0.83}O_{12}$;
$Gd_{2.10}Bi_{0.87}Fe_{4.14}Ga_{0.89}O_{12}$;
$Gd_{2.04}Bi_{0.92}Fe_{4.06}Ga_{0.98}O_{12}$;
$Gd_{2.02}Bi_{0.97}Fe_{3.96}Ga_{1.05}O_{12}$ or
$Gd_{2.12}Bi_{0.93}Fe_{4.14}Ga_{0.81}O_{12}$.

Moreover, monocrystalline iron garnets of the following compositions were manufactured:
$Gd_{2.08}Bi_{1.12}Fe_{4.10}Al_{0.29}Ga_{0.41}O_{12}$ and
$Gd_{2.13}Bi_{1.02}Fe_{4.02}Al_{0.38}Ga_{0.45}O_{12}$.

Non-crystalline (amorphous or X-ray amorphous) iron garnets were manufactured with the following compositions:
$Gd_{2.14}Bi_{0.61}Fe_{4.38}Ga_{0.87}O_{12}$;
$Gd_{2.22}Bi_{0.40}Fe_{4.46}Ga_{0.92}O_{12}$;
$Gd_{2.24}Bi_{0.35}Fe_{4.42}Ga_{0.99}O_{12}$;
$Gd_{2.17}Bi_{0.36}Fe_{4.31}Ga_{1.16}O_{12}$;
$Gd_{2.15}Bi_{0.40}Fe_{4.22}Ga_{1.23}O_{12}$;
$Gd_{2.21}Bi_{0.48}Fe_{4.45}Ga_{0.86}O_{12}$ or $Gd_{1.35}Bi_{1.30}Fe_{4.80}Al_{0.26}Ga_{0.29}O_{12}$.

According to further advantageous embodiments of the method according to the invention (111)-oriented non-magnetic garnet mono-crystalline discs or (110)-oriented non-magnetic monocrystalline discs, in particular of calcium-magnesium-zirconium-substituted gadolinium-gallium-garnet of the general formula $(Gd, Ca)_3(Ga, Mg, Zr)_5O_{12}$ were used as substrates.

However, other non-magnetic gallium garnet substrates may equally well be used.

Particularly, when using a (110)-oriented garnet monocrystalline disc the possibility is presented to manufacture optical insulators having a stress induced optical birefringent in the plane of the layer. It was established by means of X-ray double crystal rocking curves that monocrystalline layers deposited on such a substrate show an equally small X-ray linewidth as layers deposited on (111)-oriented substrates also when a high crystal lattice misfit of larger than 1% occurs between substrate and deposited monocrystalline layer, which is of importance for optical insulators with semi-leaky properties.

As already explained, non-crystalline (amorphous) and/or monocrystalline iron garnet layers can be deposited from, for example, one and the same target. The ordering of the deposited layers depends not only on the ordering of the substrate but also on the substrate temperature.

It has been found in the manufacture of optical waveguides based on iron garnet layers by means of rf cathode sputtering that the iron garnet material grows in a monocrystalline manner on monocrystalline garnet substrates when the substrates are heated at a temperature above 470° C.

At substrate temperatures below approximately 460° C. only amorphous to X-ray amorphous (non-crystalline) layers are formed no matter whether the substrate is monocrystalline or is present in another ordering. When only amorphous layers are to be deposited, for example, glass substrates may also be used advantageously.

According to the present method not only can a single monocrystalline or non-crystalline (=amorphous or X-ray amorphous) iron garnet layer of a defined refractive index n and a defined lattice constant $a_o$ can be deposited but it is also possible to deposit from a single target in a single process step a succession of monocrystalline or non-crystalline layers each time of a different refractive index n and each time of a different lattice constant $a_o$; in this manner, for example, a refractive index profile can be manfactured in the succession of layers which may be present as a step profile or as a gradient profile. According to an advantageous further embodiment of the method according to the invention a magnetron in which the rf power required for the sputtering process is fed is used as a target electrode. A magnetron produces that the plasma in the target proximity is concentrated and hence the ion bombardment of the growing layer is drastically reduced so that, for example, the backsputtering effects inter alia which detrimentally influence the monocrystalline growth of the layer are minimized. When a magnetron electrode is used it is advantageous to choose for the sputtering target a phase composition which has an as small as possible saturation magnetization to produce an optimum concentration of the plasma in the proximity of the target. Moreover, the use of a magnetron presents the advantage that the spacing between target and substrate, compared with methods which work with rf cathode sputtering devices in diode arrangement, can be optimized in the sense of employing an as small as possible plasma density and kinetic energy in the proximity of the substrate with an as high as possible deposition rate.

The method according to the invention demonstrates the following advantages: monocrystalline iron garnet layers having a refractive index n defined for the near infrared and adjustable in a range from 2.1 to 2.5 and a lattice constant $a_o$ adjustable in a defined manner in a range from 1.23 to 1.28 nm can be manufactured on a single substrate with a single device and in one process step beside non-crystalline (amorphous) iron garnet layers of a refractive index n adjustable in a defined manner in a range from 2.1 to 2.5, in which the preparation of the substrate before the beginning of the coating process can also be carried out in the same device.

For a designated wavelength range, for example $\lambda = 1.2$ to $5.0$ $\mu m$, the refractive index n of iron garnet layers can be adjusted with an accuracy of better than $\pm 0.05\%$ in a variation width of better than $\pm 1.0\%$ with a reproducibility of better than $\pm 0.02\%$ by means of the present method. This is a great advantage for an economically working large scale manufacture. The desired refractive index n and the desired lattice constant $a_o$ can be adjusted to an accuracy of approximately $\pm 1.5\%$ via the composition of the target.

In the present method it is of advantage, for example, also for the manufacture of monocrystalline iron garnet layers on a non-magnetic monocrystalline substrate that the matching of the lattice constant of substrate and layer presents much smaller problems than, for example, in a liquid phase epitaxial process, misfits of larger than 1% being tolerable. They are even required in this order of magnitude when, for example, optical insulators with semi-leaky properties are to be manufactured.

For the rf cathode sputtering there may be used commercially available cathode sputtering devices operating with rf voltage with a target cathode having a magnetic system (magnetron), in which a device for measuring the effective rf voltage is to be provided both at the target electrode and also at the substrate electrode. The magnetron cathode is incorporated horizontally in a normal vacuum recipient. The rf power required for the sputtering process is fed in the target electrode by the rf generator via an impedance matching member and thus applied to the plasma. Keeping the rf voltage constant at the target electrode at values better than $\pm 1\%$ is achieved via a computer control. The voltage at the substrate electrode is floating. The pressure and the composition of the gaseous phase are also kept constant at better than $\pm 1\%$ by computer control. A normal rf generator which is operated at an output power of 200 W serves as an energy source for the sputtering device. The operating frequency is 13.56 MHz.

The invention will now be described in greater detail, by way of example, with reference to the accompanying drawing, in which FIG. 1 is a diagrammatic sectional view of a planar waveguide as it is known from the prior art.

WL denotes the waveguide, S denotes the substrate. The waveguide shown consists of materials having refractive indices $n_1$, $n_2$ and $n_3$, in which the condition holds: $n_1 \leq n_2 \approx n_3$. The layers having the refractive indices $n_1$ and $n_2$ are monocrystalline, the layer having the refractive index $n_3$ is amorphous.

Figure 2:
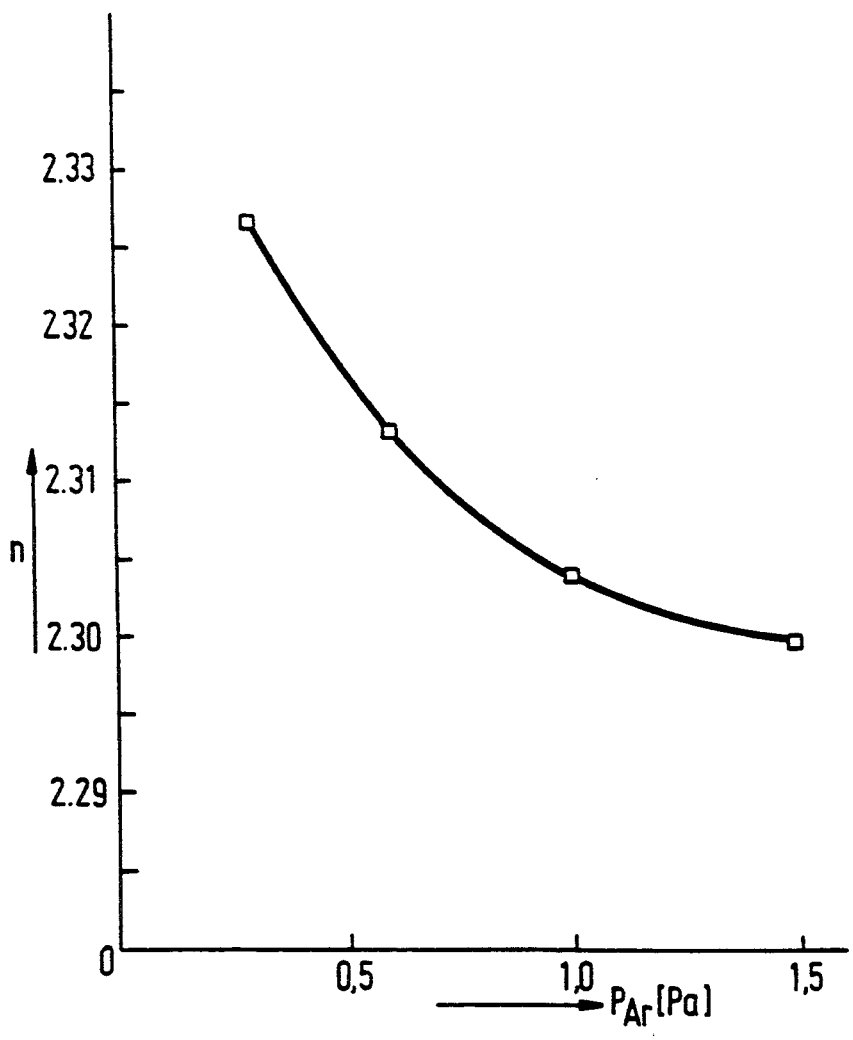
FIG. 2 is a graph showing the refractive index n of an iron garnet produced as a function of the pressure of a pure vigor plasma of the prior art.

FIG. 2 shows the refractive index n (for TE-polarized modes, $\lambda = 1.285$ $\mu m$) of monocrystalline iron garnet deposited in situ on a (111)-oriented monocrystalline non-magnetic garnet substrate of a target having the composition (in by weight) $Gd_2O_3$ 36.95, $Bi_2O_3$ 25.65, $Fe_2O_3$ 32.17, $Ga_2O_3$ 3.79 and $Al_2O_3$ 1.44 as a function of the pressure of a pure argon plasma.

Figure 3A:
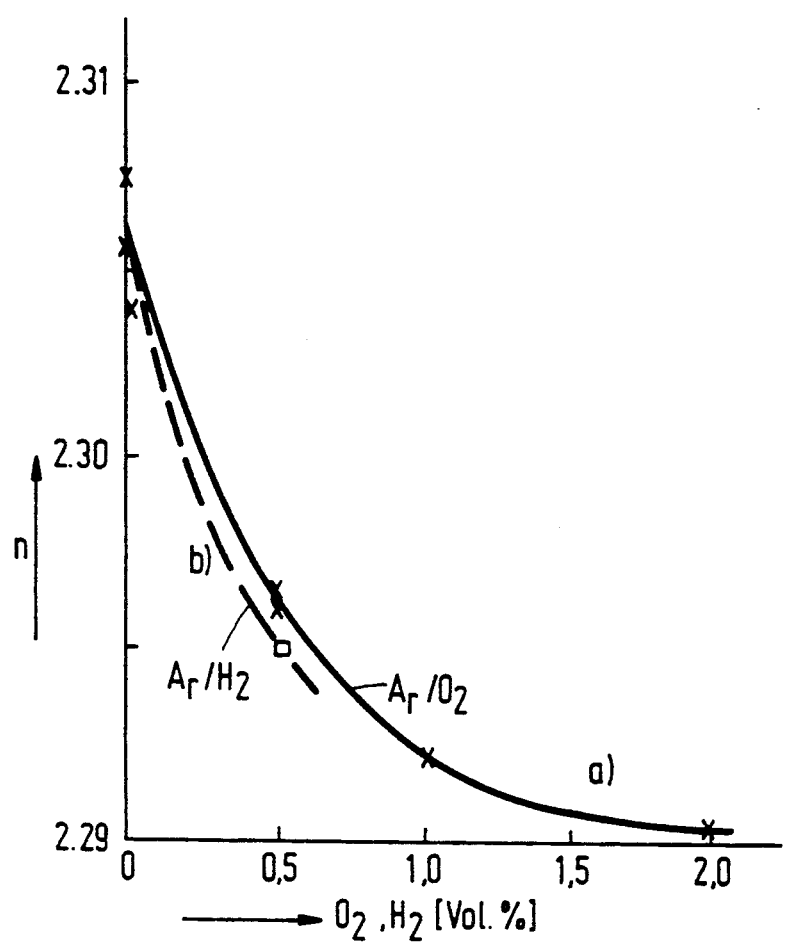
FIGS. 3a and 3b are graphs showing the refractive indices n of the iron garnets produced as a function of an addition of oxygen and hydrogen respectively to an argon-plasma according to the invention and FIG. 4 is a graph showing the refractive indices n of iron garnets produced as a function of the mass number of various usable gasses according to the invention.

FIG. 3a shows the refractive index n (for TE-polarized modes, wavelength $\lambda = 1.285$ $\mu m$) of monocrystalline iron garnet deposited in situ on a (111)-oriented gallium garnet substrate from a target having the composition (in by weight) $Gd_2O_3$ 34.44, $Bi_2O_3$ 28.52, $Fe_2O_3$ 30.91, $Ga_2O_3$ 6.13 as a function of the doping of an argon plasma with oxygen (curve a), overall gas pressure $p_{ges} = p_{Ar} + pO_2 = 0.6$ Pa and as a function of the doping of an argon plasma with hydrogen (curve b), overall gas pressure $p_{ges} = p_{Ar} + pH_2 = 0.6$ Pa, respectively.

Figure 3B:
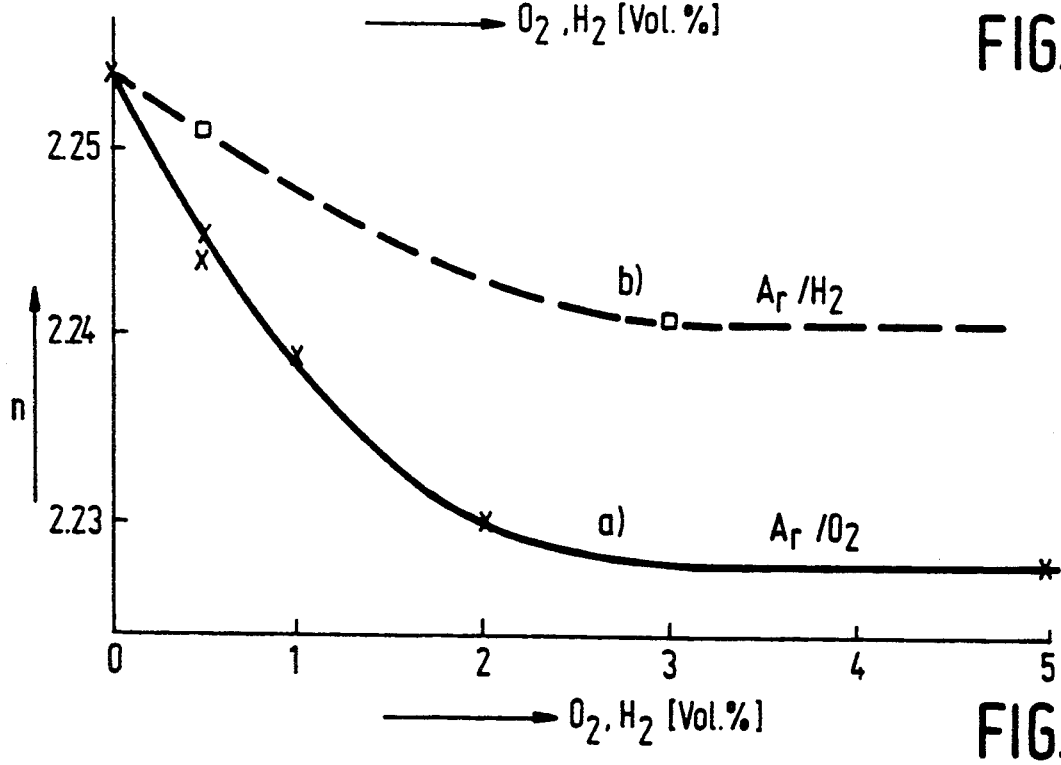

FIG. 3b shows the refractive index n (wavelength $\lambda = 1.285$ $\mu m$) of amorphous iron garnet deposited in situ from a target of the composition (in by weight) $Gd_2O_3$ 34.44, $Bi_2O_3$ 28.52, $Fe_2O_3$ 30.91 and $Ga_2O_3$ 6.13 as a function of the doping of an argon plasma with oxygen (curve a), overall gas pressure $p_{ges} = p_{Ar} + pO_2 = 0.6$ Pa and as a function of the doping of an argon plasma with hydrogen (curve b), overall gas pressure $p_{ges} = p_{Ar} + pH_2 = 0.6$ Pa, respectively. For TM and TE-polarized modes substantially corresponding values for the refractive index n are obtained within the scope of the measuring accuracy.

Figure 4:
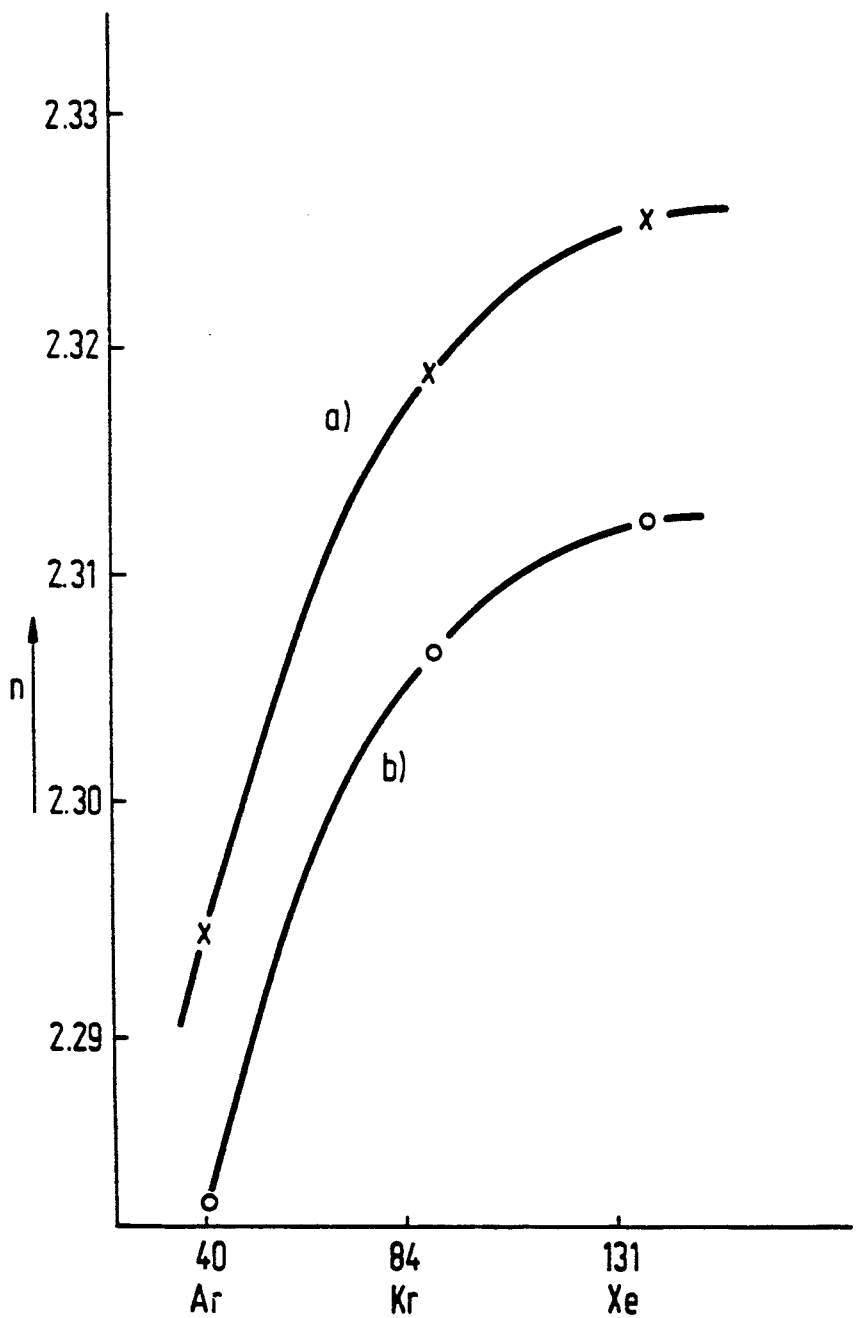

FIG. 4 shows the refractive index n (for TE-polarized modes, wavelength $\lambda = 1.285$ $\mu m$ (curve a) and $\lambda = 1.538$ $\mu m$ (curve b)) of amorphous iron garnet deposited in situ from a target of the composition (in by weight) $Gd_2O_3$ 32.34, $Bi_2O_3$ 29.06, $Fe_2O_3$ 35.66, $Ga_2O_3$ 1.80 and $Al_2O_3$ 1.14 as a function of the mass number of argon (40), krypton (84) and xenon (131).

The manufacture of a planar waveguide for non-reciprocal optical components with monocrystalline layers and material of a different ordering (non-crystalline) of bismuth-substituted gadolinium iron garnet coating same will now be described by way of example in which a part of the ion is substituted by aluminum and gallium.

(111)-oriented calcium-magnesium-zirconium-substituted gadolinium-gallium garnet monocrystalline discs having a diameter of 30 mm were used as substrates which before the deposition process were pretreated in known manner so that a monocrystalline growth can occur on them. A first monocrystalline layer having a refractive index $n_1$ of iron garnet is first deposited on these substrates. This iron garnet layer is deposited by means of the same target which will be used for the subsequent manufacture of a further monocrystalline iron garnet layer having a refractive index $n_2$. The first iron garnet layer is given a refractive index $n_1$ which is larger than the refractive index $n_2$ of the second monocrystalline layer deposited on it afterwards in that either a pressure of the plasma which is lower with respect to the conditions of the deposition of the second monocrystalline layer and/or a lower oxygen or hydrogen doping of the plasma and/or a higher share of noble gases with higher mass number than argon is adjusted in the plasma.

For the deposition of the first monocrystalline iron garnet layer having a refractive index $n_1$, argon as a noble gas at a pressure of 0.6 Pa is preferably introduced into the sputtering apparatus evacuated up to a pressure of smaller than $10^{-3}$ Pa. Such a layer having a refractive index $n_1$ which is larger than that of the second monocrystalline layer to be provided and subsequently having a refractive index $n_2$ is required to achieve monomode waveguidance in the waveguide to be manufactured. For example, a variation of the oxygen share in the plasma of 0.45% by volume to 1.0% by volume leads to a refractive index leap of approximately $5 \times 10^{-3}$ in the deposited layer with a target composition as indicated below. For monomode waveguidance it is moreover required to damp away the modes of a high order in a multilayer waveguide by providing a layer absorbing said modes. An amorphously deposited iron garnet layer having a refractive index n which is adapted to the refractive index n of the monocrystalline iron garnet layer lying below the amorphous iron garnet layer, is suitable for this absorbing layer.

As a target (cathodic sputtering source) there is employed a body manufactured from iron garnet mixed oxides by hot-pressing or sintering and having a diameter of 75 mm, a thickness of 4 mm and a porosity smaller than 10% and preferably a magnetic saturation polarization $I_S$ smaller than 3 mT.

For the following example, powder mixtures of $BiFeO_3$, $BiGd_2Fe_5O_{12}$, $Al_2O_3$ and $Ga_2O_3$ in an oxygen atmosphere at a pressure of $10^5$ Pa were sintered for 6 hours at a temperature below 920° C. the process being performed so that hardly any free $Bi_2O_3$ remains behind in the ceramic structure.

Free $Bi_2O_3$ should not be present in the target because it leads to mechanical desintegration of the surface of the target as a result of its sputtering rate which is increased with respect to the other target components; by the use of mixed oxides a homogenization of the sputtering rates of all the phase constituents of the target is achieved.

A target of the following composition (in percentages by weight) is used for the manufacture of the first monocrystalline monophase iron garnet layer of a refractive index $n_1 = 2.3244$ (for TE-polarized modes, wavelength $\lambda = 1.285$ μm) and a lattice constant $a_o = 1.2518$ nm of the composition $Gd_{2.08}Bi_{1.12}Fe_{4.10}Al_{0.29}Ga_{0.41}O_{12}$:
$Gd_2O_3$ 36.95
$Bi_2O_3$ 25.65
$Fe_2O_3$ 32.17
$Al_2O_3$ 1.44
$Ga_2O_3$ 3.79.

The target body is connected to the target electrode by means of a readily heat conducting adhesive (for example, epoxide resin filled with silver powder).

To remove dissipated heat it is advantageous to use, for example, water-cooled target electrodes.

The deposition process is carried out so that the sputtering apparatus is first evacuated by means of a vacuum pump to a pressure of smaller than $10^{-3}$ Pa, argon at a pressure of 0.3 Pa is then introduced. The spacing between target and substrate is 80 mm.

The deposition rate is approximately 1.0 μm/h. The rf voltage measured at the rf input on the rear side of the target electrode is approximately 200 V, the electric potential at the substrate electrode is floating. The substrate temperature is 520° C.

A second monocrystalline monophase iron garnet layer of a refractive index $n_2 = 2.3194$ (for TE-polarized modes, wavelength $\lambda = 1.285$ μm) and a lattice constant $a_o = 1.2514$ nm is then deposited by means of the same target and up to the pressure of the argon plasma in otherwise the same method parameters as indicated above for the deposition of the first monocrystalline iron garnet layer. The pressure of the argon plasma for the deposition of the second monocrystalline iron garnet layer is 0.47 Pa. Herewith a refractive index leap $n_1$ to $n_2 = 5 \times 10^{-3}$ is adjusted. This second monocrystalline layer has a composition according to the formula $$Gd_{2.13}Bi_{1.02}Fe_{4.02}Al_{0.38}Ga_{0.45}O_{12}.$$

A target of the following composition (in percentages by weight):
$Gd_2O_3$ 32.34
$Bi_2O_3$ 29.06
$Fe_2O_3$ 35.66
$Al_2O_3$ 1.14
$Ga_2O_3$ 1.80
is used for the manufacture of a non-crystalline (amorphous) iron garnet layer of a refractive index $n_3 = 2.3148$) for TE-polarized modes, wavelength $\lambda = 1.285$ μm) of the composition $Gd_{1.35}Bi_{1.30}Fe_{4.80}Al_{0.26}Ga_{0.29}O_{12}$.

The target body is connected to the target electrode in the manner described above. The coating process is also carried out as described above, but the substrate temperature was 455° C. and a gas atmosphere of an overall pressure $P_{ges} = 0.6$ Pa and a composition of 20% by volume of argon +79.8% by volume of krypton +0.2% by volume of oxygen was used.

From the following Tables it appears how the values for the refractive index n and the lattice constant $a_o$ can be controlled via the pressure and the composition of the plasma.

Table I gives the compositions of targets from which the iron garnet layers recorded in Tables II and III were deposited; the numeration of the targets in Tables I to III corresponds. Table II relates to monocrystalline, Table III relates to non-crystalline (amorphous) iron garnet layers.

TABLE I

| Composition | 1 | 2 | 3 | 4 |
|---|---|---|---|---|
| $Gd_2O_3$ | 34.44 | 32.34 | 27.71 | 36.95 |
| $Bi_2O_3$ | 28.52 | 29.06 | 42.06 | 25.65 |
| $Fe_2O_3$ | 30.91 | 35.66 | 27.48 | 32.17 |
| $Ga_2O_3$ | 6.13 | 1.80 | 1.53 | 3.79 |
| $Al_2O_3$ | — | 1.14 | 1.22 | 1.44 |
|  | 100.00 | 100.00 | 100.00 | 100.00 |

TABLE III

| Target Number | Gas composition [Vol. %] | | | | Gaspressure [Pa] | Monocrystalline layers | | Composition layers [atoms/garnetformula] | | | | | Figure |
|---|---|---|---|---|---|---|---|---|---|---|---|---|---|
| | Ar | Kr | $O_2$ | $H_2$ | | Refractive index n TE-MODES $\lambda = 1.285$ μm | lattice constant $a_o$ [nm] | Gd | Bi | Fe | Ga | Al | |
| 1 | 100 | — | — | — | 0.6 | 2.3061 | 1.2551 | 2.04 | 0.99 | 4.15 | 0.82 | — | 3a |
|  | 99.5 | — | 0.5 | — | 0.6 | 2.2965 | 1.2532 | 2.08 | 0.88 | 4.21 | 0.83 | — | |
|  | 99.0 | — | 1.0 | — | 0.6 | 2.2921 | 1.2530 | 2.10 | 0.87 | 4.14 | 0.89 | — | |
|  | 98.0 | — | 2.0 | — | 0.6 | 2.2904 | 1.2529 | 2.04 | 0.92 | 4.06 | 0.98 | — | |
|  | 95.0 | — | 5.0 | — | 0.6 | 2.2918 | * | 2.02 | 0.97 | 3.96 | 1.05 | — | |
|  | 99.5 | — | — | 0.5 | 0.6 | 2.2949 | 1.2547 | 2.12 | 0.93 | 4.14 | 0.81 | — | |
| 2 | — | 100 | — | — | 0.6 | 2.3675 | 1.2579 | * | * | * | * | * | |
|  | 100 | — | — | — | 0.6 | 2.3524 | 1.2571 | * | * | * | * | * | |
| 4 | 100 | — | — | — | 0.3 | 2.3244 | 1.2518 | 2.08 | 1.12 | 4.10 | 0.41 | 0.29 | 2 |

TABLE III-continued

| Target Number | Gas composition [Vol. %] | | | | Gaspressure [Pa] | Monocrystalline layers | | Composition layers [atoms/garnetformula] | | | | | Figure |
| --- | --- | --- | --- | --- | --- | --- | --- | --- | --- | --- | --- | --- | --- |
| | Ar | Kr | $O_2$ | $H_2$ | | Refractive index n TE-MODES $\lambda = 1.285\ \mu m$ | lattice constant $a_o$ [nm] | Gd | Bi | Fe | Ga | Al | |
| | 100 | — | — | — | 0.47 | 2.3194 | 1.2514 | 2.13 | 1.02 | 4.02 | 0.45 | 0.38 | |

*not determined

TABLE III

| Target Number | Gas composition [Vol. %] | | | | | Gaspressure [Pa] | Non-crystalline layers Refractive index n TE-MODES $\lambda = 1.285\ \mu m$ | Composition layers [Atoms/garnetformula] | | | | | Figure |
| --- | --- | --- | --- | --- | --- | --- | --- | --- | --- | --- | --- | --- | --- |
| | Ar | Kr | Xe | $O_2$ | $H_2$ | | | Gd | Bi | Fe | Ga | Al | |
| 1 | 100 | — | — | — | — | 0.6 | 2.2541 | 2.14 | 0.61 | 4.31 | 0.87 | — | 3b |
| | 99.5 | — | — | 0.5 | — | 0.6 | 2.2453 | 2.22 | 0.40 | 4.46 | 0.92 | — | |
| | 99.0 | — | — | 1.0 | — | 0.6 | 2.2390 | 2.24 | 0.35 | 4.42 | 0.99 | — | |
| | 98.0 | — | — | 2.0 | — | 0.6 | 2.2298 | 2.17 | 0.36 | 4.38 | 1.16 | — | |
| | 95.0 | — | — | 5.0 | — | 0.6 | 2.2272 | 2.15 | 0.40 | 4.22 | 1.23 | — | |
| | 99.5 | — | — | — | 0.5 | 0.6 | 2.2504 | 2.21 | 0.48 | 4.45 | 0.86 | — | |
| 3 | — | 100 | — | — | — | 0.5 | 2.3335 | 1.18 | 2.09 | 4.20 | 0.20 | 0.33 | |
| | 100 | — | — | — | — | 0.5 | 2.2723 | 1.66 | 1.87 | 4.00 | 0.19 | 0.28 | |
| 2 | 100 | — | — | — | — | 0.6 | 2.2947 | * | * | * | * | * | 4 |
| | — | 100 | — | — | — | 0.6 | 2.3191 | * | * | * | * | * | |
| | — | — | 100 | — | — | 0.6 | 2.3257 | * | * | * | * | * | |
| | 20 | 79.8 | — | 0.2 | — | 0.6 | 2.3148 | 1.35 | 1.30 | 4.80 | 0.29 | 0.26 | |

*not determined

We claim:

1. A method of manufacturing iron garnet layers having refractive indices n adjusted in a defined manner and lattice constants $a_o$ adjusted in a defined manner, in which the layers are deposited on a substrate by means of rf cathode sputtering using a target containing substantially an iron garnet phase besides residual phases of substantially the same sputtering rates in a noble gas plasma of an ion energy of the ions bombarding the growing layer smaller than $10^2$ev and an overall pressure in the range of 0.1 to 2.0 Pa, characterized in that the noble gas is doped with from 0.2 to 5% by volume of at least one reactive gas selected from the group consisting of hydrogen and oxygen.

2. A method as claimed in claim 1, characterized in that the noble gas is doped with from 0.2% to 2% by volume of at least one reactive gas.

3. A method as claimed in claim 1; characterized in that at least one of the gases argon, krypton or xenon is used as a noble gas.

4. A method as claimed in claim 1, characterized in that oxygen is used as a reactive gas.

5. A method as claimed in claim 1 characterized in that hydrogen is used as a reactive gas.

6. A method as claimed in claim 1 characterized in that the overall pressure is adjusted at a value in the range from 0.3 to 1.0 Pa.

7. A method as claimed in claim 1 characterized in that the iron garnet layer has a composition according to the general formula $(A, B)_3(A, B)_5O_{12}$ with A = at least a rare earth metal, Bi, Pb and/or Ca and
B = Ga, Al, Fe, Co, Ni, Mn, Ru, Ir, In and/or Sc.

8. A method as claimed in claim 1 characterized in that a (111)-oriented non-magnetic garnet monocrystalline disc is used as a substrate.

9. A method as claimed in claim 1 characterized in that a (110)-oriented non-magnetic garnet monocrystalline disc is used as a substrate.

10. A method as claimed in claim 9, characterized in that calcium-magnesium-zirconium-substituted gadolinium-gallium garnet $(Gd, Ca)_3(Ga, Mg, Zr)_5O_{12}$ is used as a substrate.

11. A method as claimed in claim 1 characterized in that the iron garnet layer(s) is (are) deposited as single crystals.

12. A method as claimed in claim 11, characterized in that the resultant iron garnet layers are deposited as a succession of layers of individual monocrystalline layers of different refractive indices n and different lattice constants $a_o$.

13. A method as claimed in claim 11 characterized in that during the layer deposition process the substrate is heated at a temperature above 470° C.

14. A method as claimed in claim 1 characterized in that the iron garnet layer(s) is (are) deposited in a non-crystalline manner.

15. A method as claimed in claim 14, characterized in that the resultant iron garnet layer is deposited as a succession of layers of individual non-crystalline layers of different refractive indices n.

16. A method as claimed in claim 14 characterized in that the substrate is heated at a temperature below 460° C.

17. A method as claimed in claim 1 characterized in that a magnetron in which the rf power required for the sputtering process is fed is used as a target electrode.

* * * * *